United States Patent [19]

Kudo et al.

[11] Patent Number: 5,309,472
[45] Date of Patent: May 3, 1994

[54] SEMICONDUCTOR DEVICE AND A METHOD FOR PRODUCING THE SAME

[75] Inventors: Hiroaki Kudo; Kazuhiko Inoguchi; Satoshi Sugahara; Haruhisa Takiguchi, all of Nara, Japan

[73] Assignee: Sharp Kabushiki Kaisha, Osaka, Japan

[21] Appl. No.: 903,785

[22] Filed: Jun. 24, 1992

[30] Foreign Application Priority Data

Jun. 24, 1991 [JP] Japan .................. 3-151546

[51] Int. Cl.⁵ .............................................. H01S 3/08
[52] U.S. Cl. ........................... 372/96; 372/45; 372/102
[58] Field of Search ............... 372/96, 45; 11/43, 102

[56] References Cited

FOREIGN PATENT DOCUMENTS

| 0244140 | 11/1987 | European Pat. Off. |
| 0455015 | 11/1991 | European Pat. Off. ............. 372/43 |
| 59-127891 | 11/1984 | Japan . |
| 0045084 | 3/1985 | Japan .................. 372/96 |
| 0240178 | 11/1985 | Japan .................. 372/96 |
| 0210688 | 9/1986 | Japan .................. 372/96 |
| 61-212084 | 9/1986 | Japan . |
| 61-212085 | 9/1986 | Japan . |
| 0242090 | 10/1986 | Japan .................. 372/96 |
| 01-248585 | 12/1987 | Japan . |
| 0266489 | 11/1991 | Japan .................. 312/96 |

OTHER PUBLICATIONS

Burnham et al., *Electronics Letters* (Dec. 9, 1982) 18(25):1095–1097.

Turco et al., *Journal of Crystal Growth* (1990) 104:766–772.

Oishi et al., "MOVPE-Grown 1.5 μm Distributed Feedback Laser on Corrugated InP Substrates", *I.E.E.E. Journal of Quantum Electronics* (1987), vol. QE-23, No. 6, pp. 822–827.

Luo et al., "Purely gain-coupled distributed feedback semiconductor lasers", *Applied Physics Letters* (1990), vol. 56, No. 17, pp. 1620–1622.

*Primary Examiner*—Georgia Y. Epps
*Attorney, Agent, or Firm*—Morrison & Foerster

[57] ABSTRACT

A semiconductor device includes a multiple layer structure including a substantially flat active layer, and a first semiconductor layer and a second semiconductor layer adjacent to each other, the semiconductor layers having a corrugation at an interface therebetween; and a generating device which is connected to the multiple layer structure. An electromagnetic field intensity distribution is generated by use of the generating device in a waveguide region including the active layer, and the active layer includes a gain distribution having a distribution pattern corresponding to the corrugation. The multiple layer structure is produced by forming the corrugation on an upper surface of the first semiconductor layer, and forming the rest of the multiple layer structure including the second semiconductor layer and the active layer by using a vapor phase growth method once so as to make the active layer substantially flat. Then, the generating device is formed to be in contact with the multiple layer structure.

46 Claims, 7 Drawing Sheets

FIG. 1B OPTICAL FIELD INTENSITY

SEMICONDUCTOR DEVICE AND A METHOD FOR PRODUCING THE SAME

BACKGROUND OF THE INVENTION

1. Field of the Invention

The present invention relates to a semiconductor device including an optical device and an electron device and a method for producing the same. In particular, the present invention relates to an optical device such as an integrable wavelength-controlled semiconductor laser and also to a high speed and low power consumption electron device.

2. Description of the Prior Art

Recently, a distributed Bragg reflection (DBR) laser and a distributed feedback (DFB) laser have been developed. These types of lasers have excellent characteristics as a single longitudinal mode laser.

The wavelength of light reflected in parallel generated from parallel incident light in a diffraction grating is expressed by the formula: $\lambda_0 = 2N_{eff}\Lambda/m$, where $N_{eff}$ is an equivalent refractive index, $\Lambda$ is the periodicity of the diffraction grating, and m is the order of the diffraction grating. In the DBR laser and the DFB laser, oscillation in a single longitudinal mode is realized by utilizing wavelength selectivity.

FIG. 9 is a schematic view of an AlGaAs DFB laser as an example of such known semiconductor lasers. The DFB laser shown in FIG. 9 is produced in the following manner. On a GaAs substrate 901, a cladding layer 902, an active layer 903, and an optical guide layer 904 are sequentially grown by a first epitaxial growth, and a diffraction grating 907 having a specific periodicity is formed on a surface of the optical guide layer 904. Then, a cladding layer 905 and a contact layer 906 are grown by a second epitaxial growth on the diffraction grating 907.

As is apparent from the above, in order to produce a semiconductor laser such as the one shown in FIG. 9, the epitaxial growth must be performed at least twice. Moreover, it is necessary to form a diffraction grating at a sufficiently close position to an active layer so that the diffraction grating can fully influence an optical field intensity distribution which is generated in the optical waveguide region including the active layer. In a semiconductor laser having such a structure, a non-radiative recombination center which is generated at the interface along the diffraction grating reduces the light emitting efficiency and the reliability of the laser. Moreover, freedom of design of device structure is restricted.

FIG. 10 is a schematic view of an InP DFB laser as another example of known semiconductor lasers. In the InP DFB laser, as distinct from the AlGaAs DFB laser, no oscillating light is absorbed into the substrate. Therefore, it is possible to form a diffraction grating 1006 on a substrate 1001. Accordingly, the rest of the multiple layer structure including an optical guide layer 1002, an active layer 1003, a cladding layer 1004, and a contact layer 1005 can be formed by performing an epitaxial growth only once. However, as in the AlGaAs DFB laser shown in FIG. 9, it is required that the active layer 1003 be positioned sufficiently close to the diffraction grating 1006. Accordingly, the semiconductor laser of FIG. 10 also has the problems that the light emitting efficiency and the product reliability are reduced and freedom of design of the device structure is restricted.

An optical device and an electron device employing an ultra thin semiconductor film have recently been studied in order to utilize a variety of quantum effects for obtaining higher performance.

FIG. 11 is a schematic view of a quantum well laser as an example of such devices. In the quantum well laser, the movement of electrons and holes is confined within a quantum well layer 1102 in a thickness direction by a pair of confining layers 1101 and 1103. Therefore, the quantum well laser has advantages such as lowered threshold current density and improved temperature characteristics, as described in Electronics Letters, vol. 18, 1095 (1982).

In such a quantum well, however, the electrons and holes are quantized only in a thickness direction, but not in a direction on a plane parallel to a main surface of the quantum well layer. Therefore, the reduction of the threshold current density and the improvement of the temperature characteristics are not sufficient. In order to solve these problems, semiconductor lasers having curved active layers as shown in FIGS. 12 and 13 are proposed. The lasers of FIGS. 12 and 13 can attain quantum wire effects and quantum box effects, respectively (Japanese Laid-Open Patent Publication Nos. 61-212084 and 61-212085, Journal of Crystal Growth 104 (1990), pp. 766-772).

In each of the lasers of FIGS. 12 and 13, a single active layer or a multiple active layer structure is formed as a gain area. The active layer is sufficiently thin to generate quantum effects and includes a diffraction grating having a sufficiently short periodicity to generate additional quantum effects in a direction on a plane parallel to a main surface of the active layer. By this construction, quantum wire effects and quantum box effects are obtained, namely, the movement of the electrons and holes is confined in a direction of the periodicity of the corrugation as well as in the thickness direction. As a result, semiconductor devices with improved performance are produced.

However, in order to form an active layer having a diffraction grating which is appropriate to obtain quantum effects, it is necessary to position the active layer within a short distance from the corresponding corrugation formed on the substrate. This means that the freedom in designing the device structure is restricted. Moreover, it is difficult to avoid the problems arising from the non-radiative recombination center generated at the interface along the corrugation formed on the substrate.

SUMMARY OF THE INVENTION

The semiconductor device according to the present invention includes a multiple layer structure including an active layer which is substantially flat, a first semiconductor layer and a second semiconductor layer adjacent to each other, the semiconductor layers having a corrugation at an interface therebetween; and a generating device which is connected to the multiple layer structure. An electromagnetic field intensity distribution is generated by use of the generating device in a waveguide region including the active layer, and the active layer includes a gain distribution having a distribution pattern corresponding to the corrugation.

Alternatively, an optical field intensity distribution is generated by use of the generating device in a waveguide region including the active layer, the corrugation is periodical, and the active layer includes a gain distribution having a distribution pattern corresponding to the corrugation.

Alternatively, the active layer is sufficiently thin to generate quantum effects, an electronic field intensity distribution is generated by use of the generating device in a waveguide region including an active layer, and the active layer includes a gain distribution having a distribution pattern corresponding to the corrugation.

The method for producing a semiconductor device as described above according to the present invention includes the steps of preparing the multiple layer structure by forming the corrugation on an upper surface of the first semiconductor layer, and forming the rest of the multiple layer structure including the second semiconductor layer and the active layer by using a vapor phase growth method once so as to make the active layer substantially flat; and forming the generating device to be in contact with the multiple layer structure.

Thus, the invention described herein makes possible the advantages of (1) providing an optical device which has excellent optical characteristics, is easy to produce, and has high reliability, and a method for producing the same; (2) providing an optical device and an electron device each of which is easily integrated into a monolithic device and able to generate a high coupling efficiency, and a method for producing the same; and (3) providing a quantum wire device and a quantum box device each of which has a high operating speed and a low power consumption, and a method for producing the same.

These and other advantages of the present invention will become apparent to those skilled in the art upon reading and understanding the following detailed description with reference to the accompanying figures.

BRIEF DESCRIPTION OF THE DRAWINGS

FIG. 1B is a graph illustrating an optical field intensity distribution of the semiconductor device according to the present invention.

DETAILED DESCRIPTION OF THE PREFERRED EMBODIMENTS

Figure 1A:
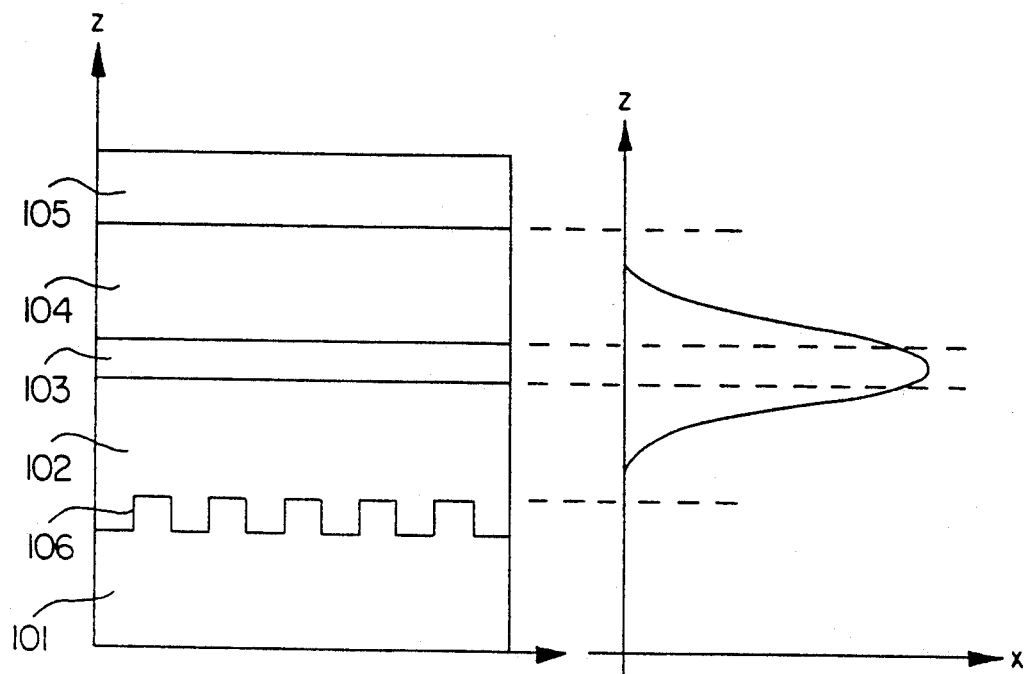
FIG. 1A is a conceptual view showing a principle according to the present invention.
Figure 1C:
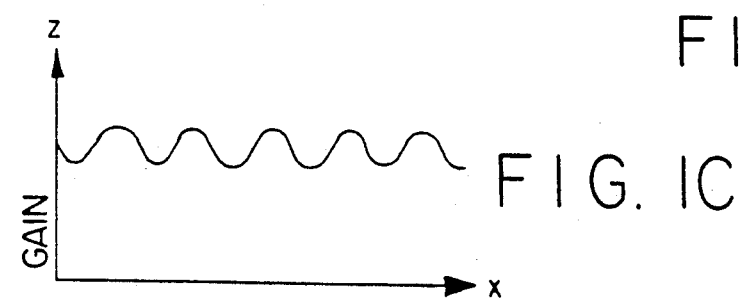
FIG. 1C is a graph illustrating a gain distribution in an active layer of the semiconductor device according to the present invention.
Figure 1D:
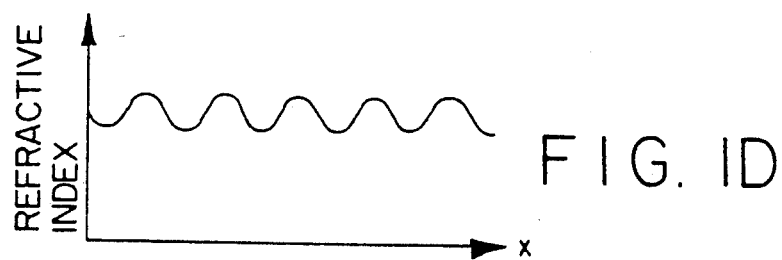
FIG. 1D is a graph illustrating a refractive index distribution in the active layer of the semiconductor device according to the present invention.

The principle of a semiconductor device according to the present invention will be described with a semiconductor laser as an example. FIG. 1A is a conceptual view thereof. In FIG. 1A, a semiconductor substrate 101 has a periodical corrugation 106 on a surface thereof. On the periodical corrugation 106, a first cladding layer 102, an active layer 103, a second cladding layer 104, and a contact layer 105 are sequentially formed in a single process by use of a vapor phase growth method, thereby forming a multiple layer structure including an optical waveguide region having the active layer 103.

The active layer 103 can be formed to be substantially flat by performing the vapor phase growth under appropriate conditions. The corrugation 106 influences the vapor phase growth, and as a result, a gain distribution having a periodicity corresponding to that of the corrugation 106 is obtained. A refractive index distribution having a periodicity corresponding to that of the corrugation 106 may also be obtained.

In such a semiconductor laser, wavelength selectivity is realized by a periodical gain distribution obtained in the active layer 103. The wavelength selectivity may be realized also by a refractive index distribution. Thus, the corrugation 106 can be positioned outside an electromagnetic field intensity distribution such as an optical field intensity distribution. Accordingly, the generation of a non-radiative recombination center at the interface along the corrugation 106 does not lower the light emitting efficiency or the reliability of the laser.

The corrugation 106 is formed outside the optical field intensity distribution when the distance between the active layer 103 and the corrugation 106 is not less than the guide wavelength d, which is defined by $d = \lambda/n$, where $\lambda$ is the oscillating wavelength and n is the effective refractive index. The above distance is preferably not less than 0.4 $\mu$m and more preferably from 0.5 to 1.0 $\mu$m.

Moreover, a quantum wire device and a quantum box device can be produced in the following manner according to the present invention. The active layer 103 is formed to be sufficiently thin to generate quantum effects. In addition, the corrugation 106 is formed in such a pattern as generates quantum effects in the active layer 103 due to a gain distribution generated in at least one direction parallel to the active layer. The quantum effects may also be generated due to a refractive index distribution generated in at least one direction parallel to the active layer.

Hereinafter, the present invention will be described by way of illustrating examples with reference to the accompanying drawings.

EXAMPLE 1

An AlGaAs semiconductor laser will be described as a first example according to the present invention.

Figure 2A:
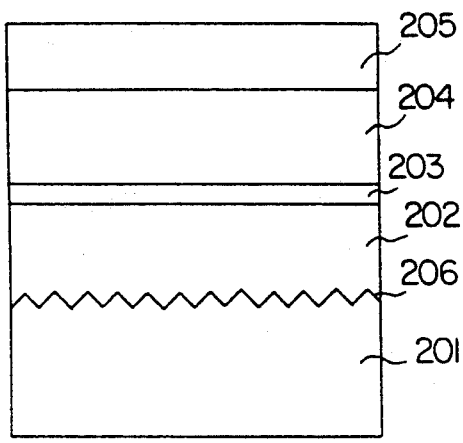
FIG. 2A is a schematic view of a semiconductor laser as a first example according to the present invention.
Figure 2B:
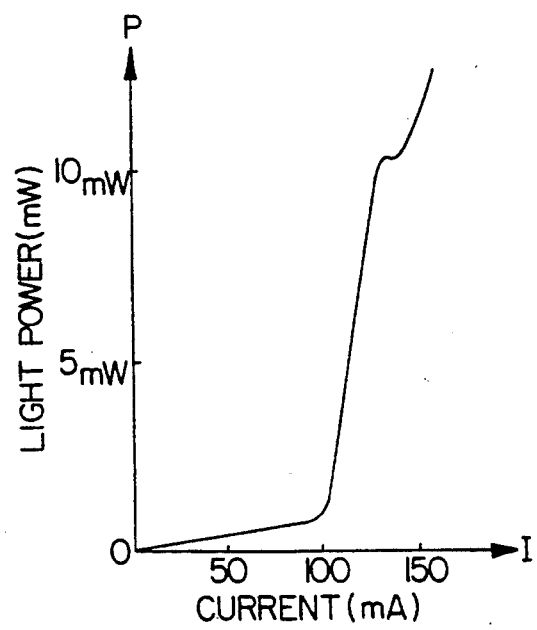
FIG. 2B is a graph illustrating the current-light power characteristic of the semiconductor laser as the first example.
Figure 2C:
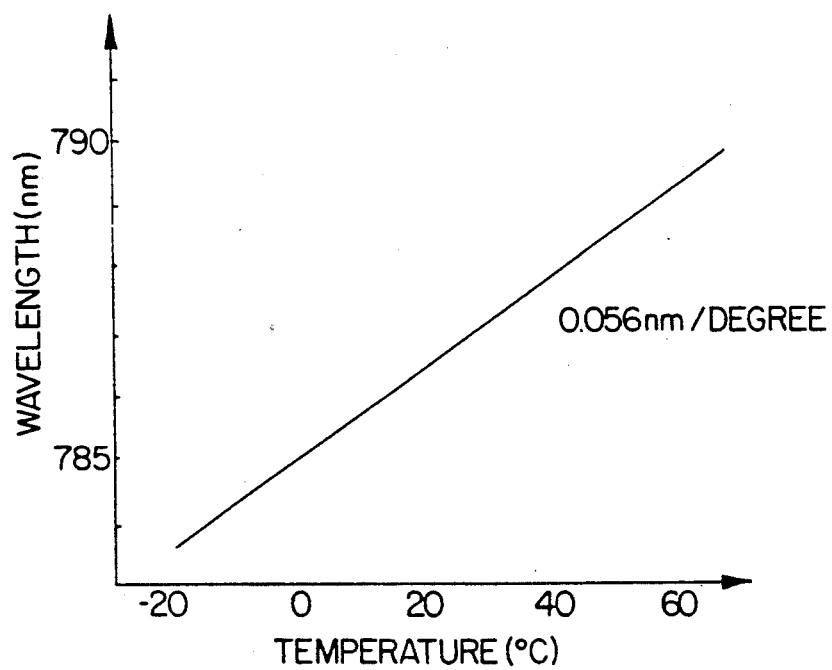
FIG. 2C is a graph illustrating the dependence on the temperature of the oscillating wavelength of the semiconductor laser as the first example.

FIG. 2A is a cross sectional view of a central portion of the AlGaAs semiconductor laser taken along a plane parallel to an optical waveguide direction, and FIGS. 2B and 2C are graphs illustrating representative characteristics of this semiconductor laser.

In FIG. 2A, a corrugation 206 having a periodicity $\Lambda$ of 200 to 250 nm is formed on a main surface of an n-GaAs substrate 201. The corrugation 206 is formed by the combination of known techniques such as holographic exposure and etching, or electron beam exposure and etching. On the n-GaAs substrate 201 having the corrugation 206, an n-$Al_{0.5}Ga_{0.5}As$ cladding layer 202 (thickness: 0.5 μm), an $Al_{0.13}Ga_{0.87}As$ active layer 203 (thickness: 0.1 μm), a p-$Al_{0.5}Ga_{0.5}As$ cladding layer 204 (thickness: 1.0 μm), and a p-GaAs contact layer 205 (thickness: 1.0 μm) are sequentially grown by use of a low-pressure metal organic chemical vapor deposition (MOCVD). In this way, a multiple layer structure for the semiconductor laser is produced. The active layer 203 can be formed to be substantially flat under appropriate conditions, for example, with a growth temperature of 600° C. to 750° C. and a V/III ratio of 60 to 120.

Next, an electrode having a 10 μm contact stripe is formed on an upper surface of the contact layer 205, and another electrode is formed on a bottom surface of the substrate 201, thereby producing a semiconductor laser.

FIG. 2B illustrates the current-light power characteristic. As is shown in FIG. 2B, the threshold current $I_{th}$ is approximately 110 mA, and the driving current $I_{op}$ at 10 mW is approximately 140 mA. These characteristics are similar to those of a conventional Fabry-Pérot laser, which means there is substantially no optical absorption loss. Therefore, it is apparent that no optical field intensity distribution is existent on the corrugation 206.

FIG. 2C illustrates the dependence of the oscillating wavelength on the temperature when the semiconductor laser is driven by a 10 mW· APC pulse. The temperature range $\Delta T$, in which a dynamic single longitudinal operating mode is obtained, has an upper range of approximately 80° C. Thus, the semiconductor laser has a satisfactory DFB mode characteristic.

From the above description, it is apparent that the periodicity of a gain distribution of the optical waveguide region including the active layer 203 corresponds to that of the corrugation 206 formed on the n-GaAs substrate 201. A refractive index distribution may also be generated in the optical waveguide region, the periodicity thereof corresponding to that of the corrugation 206.

Such gain distribution and refractive index distribution are considered to be obtained for the following reason. The growth speed of the layers grown by use of the vapor phase growth method varies depending on the different facets along the corrugation 206. Therefore, the stress strain corresponding to the periodicity of the corrugation 206 is generated in the optical waveguide region including the active layer 203. Such a stress strain is more conspicuous as the composition ratio difference between the grown layers is larger and as the growth temperature is higher.

The density of an impurity which is incorporated into each grown semiconductor layer also varies depending on the growth speed, which depends on the facet of the corrugation.

Therefore, it is assumed that the periodicity of the corrugation 206 can be reflected in the layers grown thereon by employing an appropriate growth condition in accordance with the growth temperature, the growth pressure, the flow rate of the material gas, and the like.

EXAMPLE 2

An AlGaAs semiconductor laser having an oscillating wavelength around 830 nm will be described as a second example according to the present invention.

Figure 3:
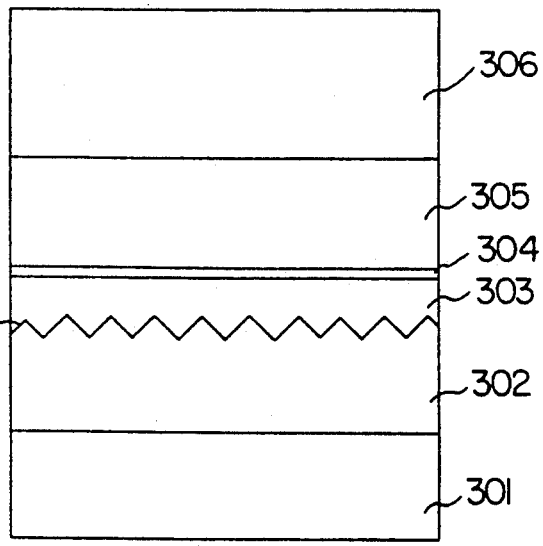
FIG. 3 is a schematic view of a semiconductor laser as a second example according to the present invention.

FIG. 3 is a cross sectional view of a central portion of this semiconductor laser taken along a plane parallel to an optical waveguide direction.

In FIG. 3, an n-GaAs substrate 301 has an n-$Al_{0.45}Ga_{0.55}As$ impressing layer 302 formed thereon. On a main surface of the impressing layer 302, a corrugation 307 having a periodicity $\Lambda$ of 200 to 250 nm is formed by use of known techniques. On the n-$Al_{0.45}Ga_{0.55}As$ impressing layer 302 having the corrugation 307, an n-$Al_{0.45}Ga_{0.55}As$ cladding layer 303, an $Al_{0.05}Ga_{0.95}As$ active layer 304, a p-$Al_{0.45}Ga_{0.55}As$ cladding layer 305, and a p-GaAs contact layer 306 are sequentially grown by use of a low-pressure MOCVD. In this way, a multiple layer structure for the semiconductor laser is produced. The active layer 304 can be formed to be substantially flat by controlling the growth temperature, the V/III ratio and the layer thickness.

The second example is distinct from the first example since the impressing layer 302 and the cladding layer 303 have an identical composition ratio with each other and the refractive index is not modulated on the corrugation 307. However, under appropriate growth conditions, the similar effects as those described in the first example can be obtained. As a result, a gain distribution having a periodicity corresponding to that of the corrugation 307 is generated in an optical waveguide region including the active layer 304. A refractive index distribution having the same periodicity may also be generated in the optical waveguide region.

Therefore, a semiconductor laser showing a satisfactory DFB mode characteristic can be produced although geometrically no corrugation is existent within the multiple layer structure thereof.

EXAMPLE 3

An InP semiconductor laser having an oscillating wavelength around 1.3 μm will be described as a third example according to the present invention.

Figure 4:
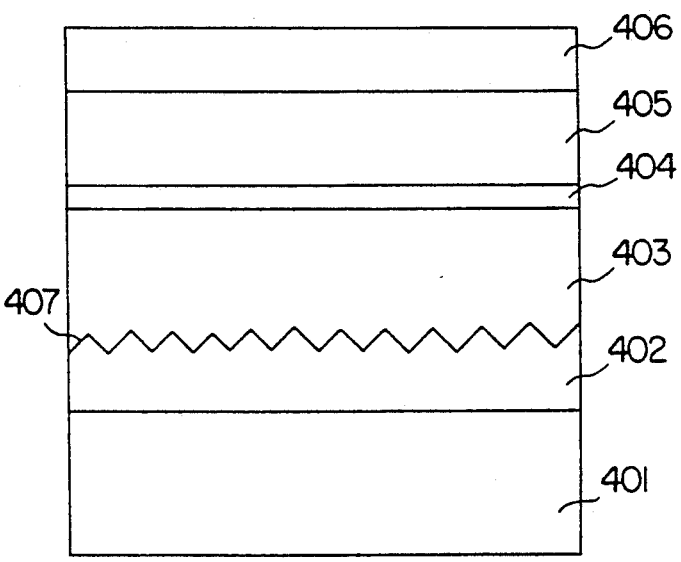
FIG. 4 is a schematic view of a semiconductor laser as a third example according to the present invention.

FIG. 4 is a cross sectional view of a central portion of this semiconductor laser taken along a plane parallel to an optical waveguide direction.

As is shown in FIG. 4, a multiple layer structure of this semiconductor laser includes an InP substrate 401, an InGaAsP impressing layer 402 having a corrugation 407, an InP first cladding layer 403, an InGaAsP active layer 404, an InP second cladding layer 405, and an InGaAsP contact layer 406.

In the third example, the corrugation 407 is formed not on the substrate 401 but on an upper surface of the impressing layer 402 in order to prevent the deformation of the corrugation 407 during the growth process of the layers.

Figure 10:
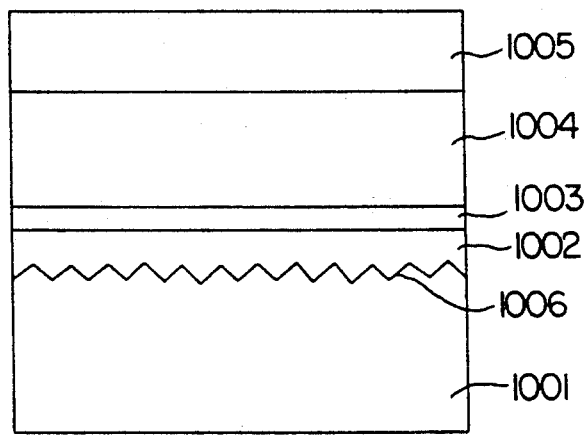
FIG. 10 is a schematic view of another conventional semiconductor laser.
Figure 11:
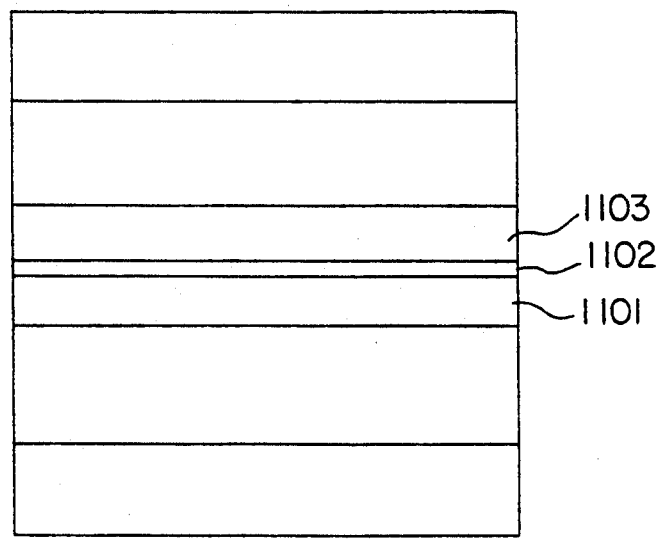
FIG. 11 is a schematic view of a conventional semiconductor laser having a quantum well structure.
Figure 12:
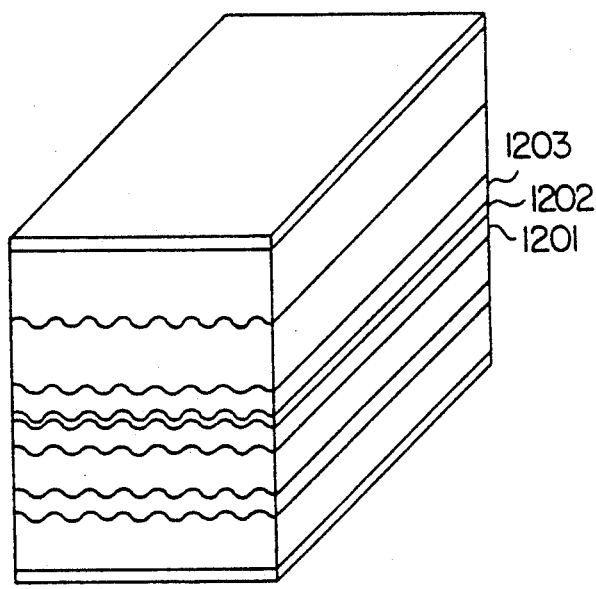
FIG. 12 is another conventional semiconductor laser having a quantum well structure.
Figure 13:
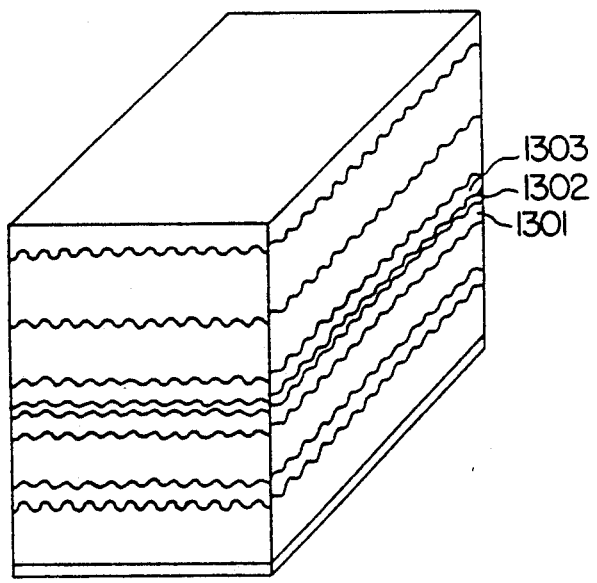
FIG. 13 is still another conventional semiconductor laser having a quantum well structure.

The semiconductor laser of the third example is distinct from the conventional InP DFB laser shown in FIG. 10 since the active layer 404 and the corrugation 407 are separated from each other by at least a guide wavelength ($d = \lambda/n$; where d: guide wavelength, $\lambda$: oscillating wavelength, n: effective refractive index; d: approximately 0.4 μm in this case).

As in the first and the second examples, since a gain distribution having a periodicity corresponding to that of the corrugation 407 is obtained in the active layer 404. A refractive index distribution having the same periodicity may also be obtained in the active layer 404. Accordingly, the semiconductor laser shows a satisfactory DFB mode characteristic. Moreover, since an optical field intensity distribution generated in an optical waveguide region including the active layer 404 is nonexistent on the corrugation 407, the generation of a non-radiative recombination center at the interface along the corrugation 407 does not adversely affect the semiconductor laser.

EXAMPLE 4

A ZnCdSSe semiconductor laser having an oscillating wavelength around 460 nm will be described as a fourth example according to the present invention.

Figure 5:
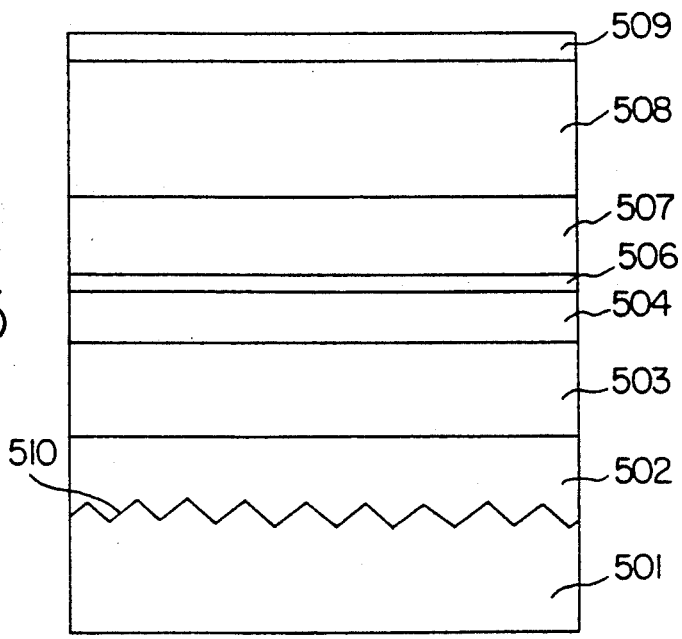
FIG. 5 is a schematic view of a semiconductor laser as a fourth example according to the present invention.

FIG. 5 is a cross sectional view of a central portion of this semiconductor laser taken along a plane parallel to an optical waveguide direction.

In FIG. 5, an n-GaAs substrate 501 has a corrugation 510 having a specified periodicity $\Lambda$ formed on a main surface thereof by use of known techniques. The specified periodicity $\Lambda$ is approximately 80 to 100 nm and approximately 160 to 200 nm in order to obtain the first-order diffraction grating effect and the second-order diffraction grating effect, respectively. On the n-GaAs substrate 501 having the corrugation 510, an n-ZnSe buffer layer 502, a ZnSSe cladding layer 503 (thickness: 2.5 μm), a ZnSe SCH layer 504 (thickness: 0.5 μm), a ZnCdSe active layer 506 (thickness: 10 μm), a ZnSe SCH layer 507 (thickness: 0.5 μm), a ZnSSe cladding layer 508 (thickness: 1.5 μm), and a ZnSe contact layer 509 (thickness: 0.1 μm) are sequentially grown by use of a low-pressure MOCVD. In this way, a multiple layer structure for the semiconductor laser is produced.

As in the preceding examples, the active layer 506, which can be formed to be substantially flat by controlling the growth conditions, obtains a gain distribution having a periodicity corresponding to that of the corrugation 510. A refractive index distribution having the same periodicity may also be obtained in the active layer 506.

Moreover, since no optical field intensity distribution is existent on the corrugation 510, no problem arises regarding the light emitting efficiency or the reliability of the product. Thus, according to the present invention, a desired DFB laser can be realized also by use of ZnCdSSe semiconductors.

EXAMPLE 5

Figure 6:
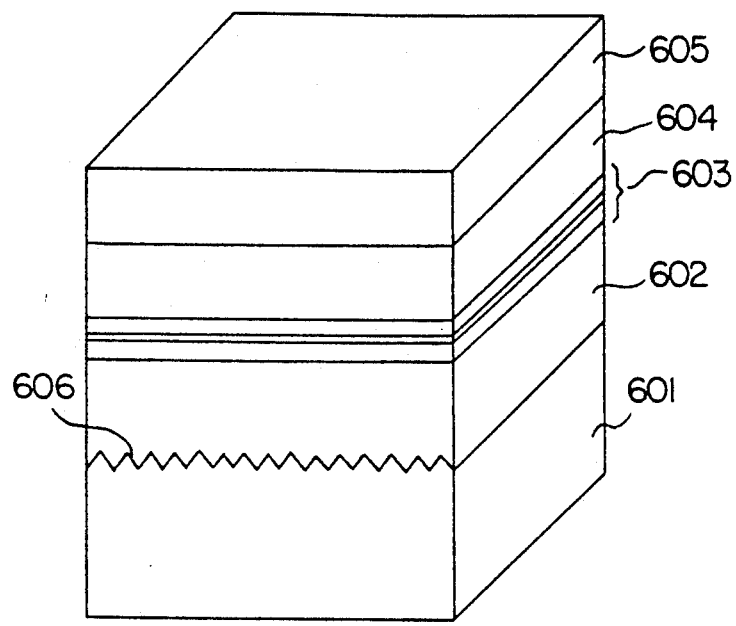
FIG. 6 is a schematic view of a semiconductor laser having a quantum well structure as a fifth example according to the present invention.

FIG. 6 is a schematic view of an AlGaAs semiconductor quantum wire laser as a fifth example according to the present invention.

In FIG. 6, an n-GaAs substrate 601 has a corrugation 606 having a periodicity $\Lambda$ of 50 to 100 nm formed on a main surface thereof. On the n-GaAs substrate 601 having the corrugation 606, an n-AlGaAs cladding layer 602, an AlGaAs GRIN.SCH.SQW (graded-index-of-refraction separate-confinement-heterostructure single-quantum-well) layer 603, a p-AlGaAs cladding layer 604, and a p-GaAs contact layer 605 are sequentially grown by use of a low-pressure MOCVD. In this way, a multiple layer structure for the semiconductor quantum wire laser is produced.

The above corrugation 606 is preferably formed by the combination of an electron beam exposure and a dry etching technique such as a reactive ion etching (RIE) by use of a chlorine gas. This combination provides a periodic corrugation having a larger aspect ratio which can more strongly influence the layers formed thereon.

The fifth example is distinct from the preceding examples since an active layer is included in the GRIN.SCH.SQW layer 603 and the corrugation 606 has a sufficiently short periodicity to generate quantum effects. Accordingly, in the GRIN.SCH.SQW layer 603, the quantum effects are generated not only in a thickness direction but also in a direction of the periodicity of a gain distribution corresponding to that of the corrugation 606. The quantum effects may be generated in a direction of the periodicity of a refractive index distribution corresponding to that of the corrugation 606. As a result, one-dimensional quantum wire effects can be obtained. According to the present invention, a semiconductor quantum wire laser having a low power consumption and high speed response can be realized.

EXAMPLE 6

Figure 7:
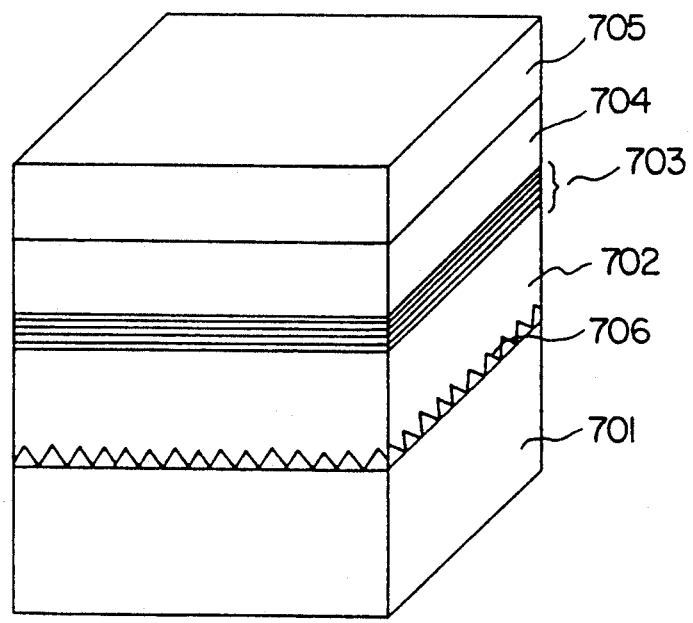
FIG. 7 is a schematic view of a semiconductor laser having a quantum well structure as a sixth example according to the present invention.

FIG. 7 is a schematic view of a semiconductor quantum box laser as a sixth example according to the present invention.

In FIG. 7, an n-GaAs substrate 701 has a two-dimensional corrugation 706 on a main surface thereof, the corrugation 706 having a specified periodicity each in an optical waveguide direction and a direction perpendicular thereto. The periodicity $\Lambda$ of the corrugation in the optical waveguide direction should be approximately 0.1 μm in order to obtain the first-order diffraction grating effect for a DFB laser operation. The periodicity in the direction perpendicular to the optical waveguide direction should be 0.1 μm or less in order to confine the electrons and holes effectively.

On the corrugation 706, a cladding layer 702, a MQW (multiple-quantum-well) layer 703, a cladding layer 704, and a contact layer 705 are sequentially grown by use of a low-pressure MOCVD. In this way, a multiple layer structure for the semiconductor quantum box laser is produced.

In the sixth example, the MQW layer 703, having the quantum effects in the thickness direction, obtains additional two-dimensional quantum effects by a gain distribution which corresponds to the two-dimensional corrugation 706. The additional two-dimensional quantum effects may also be obtained by a refractive index distribution which corresponds to the two-dimensional corrugation 706. Therefore, zero-dimensional quantum box effects can be obtained. As a result, a DFB laser having an extremely low power consumption and an extremely high speed response can be realized.

EXAMPLE 7

Figure 8:
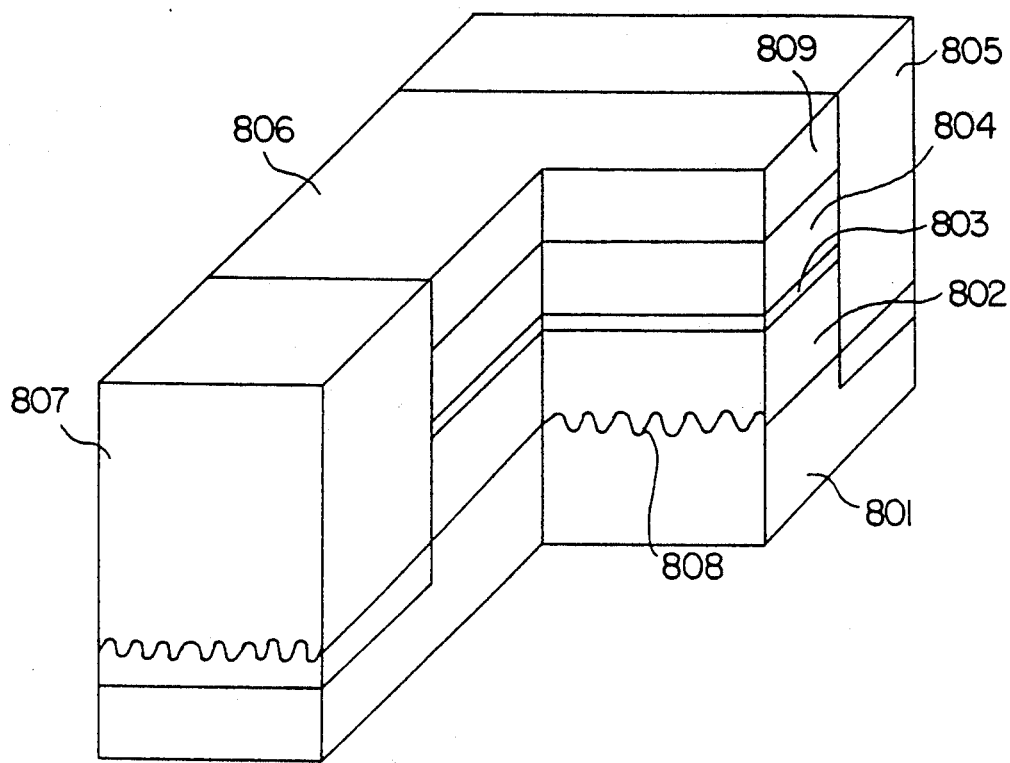
FIG. 8 is a schematic view of a semiconductor device having a quantum well structure as a seventh example according to the present invention.
Figure 9:
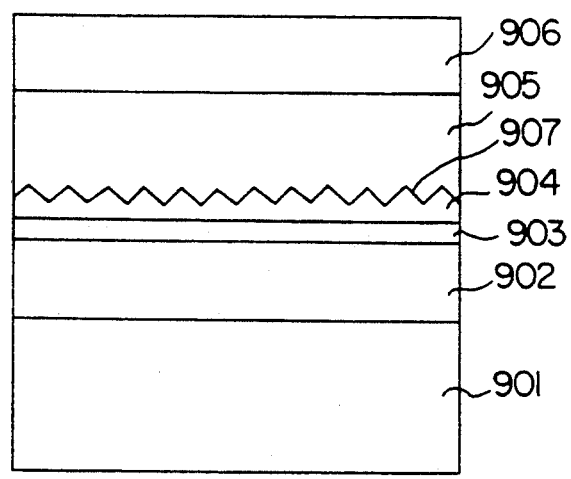
FIG. 9 is a schematic view of a conventional semiconductor laser.

FIG. 8 is a schematic view of a quantum wire transistor as a seventh example according to the present invention.

In FIG. 8, a GaAs substrate 801 has a corrugation 808 formed on a main surface thereof, the corrugation 808 having a periodicity which is the same or shorter than the de Broglie wavelength of electrons (<30 nm). On the substrate 801 having the corrugation 808, a GaAs channel layer 802, an AlGaAs spacer layer 803 having a quantum well structure, an AlGaAs carrier doping layer 804, and a GaAs contact layer 809 are sequentially grown by use of a low-pressure MOCVD. Then, a source area 807, a drain area 805, and a gate area 806 interposed between the source area 807 and the drain area 805 are formed by ion implantation. After that, an electrode is formed in each area to produce a quantum wire transistor device.

In the spacer layer 803, which corresponds to the active layer of the preceding examples, the modulation of the energy band is generated in a direction perpendicular to the movement of electrons, in correspondence to the periodicity of the corrugation 808. Thus, quantum wire effects can be obtained in the same manner as that of the fifth example. Therefore, a change of the gate voltage affects the localization of electrons, resulting in a variation of the electron mobility. According to the present invention, a low power consumption and high speed response quantum wire transistor can be produced.

The present invention is not limited to the above examples, but the following variations offer the similar effects as those in the above examples.

The present invention is applied not only to a DFB laser and a transistor, but also to other optical devices and electron devices including a DBR laser, a DR laser and a wavelength-selective filter device.

Although the AlGaAs, and InP and ZnCdSSe semiconductors are used in the above examples, other semiconductor compound materials including the III-V group such as the InGaAlP semiconductor, the II-VI group, and the I-III-V group may also be used.

The corrugation is not limited to a periodical one. Especially in the case of a quantum wire device, any type of pattern is usable as long as the pattern contributes to generate desired quantum effects. The shape of the corrugation may be triangular, rectangular, sawtooth-like or any other shape.

The vapor phase growth method may be a molecular beam epitaxy (MBE) or the like instead of a MOCVD.

As is apparent from the above description, according to the present invention, a corrugation is formed on a semiconductor substrate or on a semiconductor layer laminated on the semiconductor substrate, and multiple semiconductor layers including a substantially flat active layer is formed on the corrugation by performing a vapor phase growth only once. Thus, the active layer of the resultant semiconductor device has a gain distribution reflecting the structure of the corrugation. The active layer may also have a refractive index distribution reflecting the structure of the corrugation. In this way, a wavelength-controlled semiconductor laser having excellent characteristics is easily produced. In addition, a high-speed, low power consumption semiconductor device which utilizes quantum effects is also realized in the same manner.

The flatness of the waveguide region including the active layer offers a high coupling efficiency when the semiconductor device according to the present invention is integrated into a monolithic device for realizing a next-generation OEIC (optoelectronic IC).

Further, no optical field intensity distribution is existent on the corrugation according to the present invention. This fact offers the advantages that the generation of a non-radiative recombination center at the interface along the corrugation does not adversely affect the semiconductor device, a high level of freedom in designing the device structure can be obtained, and a dry etching can be employed for forming the corrugation because the problem of damaging the interface is negligible.

The present invention further has the following remarkable effect. Since the gain distribution and the refractive index distribution are formed in the whole region of the waveguide region including the active layer, a dynamic single longitudinal mode oscillation characteristic which has a high coupling efficiency can be obtained. The level of the coupling efficiency can easily be adjusted by controlling the growth conditions or the device structure.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device, comprising:
   a multiple layer structure including an active layer which is substantially flat, a first semiconductor layer and a second semiconductor layer adjacent to each other, the semiconductor layers having a corrugation at an interface therebetween; and
   generating means which is connected to the multiple layer structure,
   wherein an electromagnetic field intensity distribution is generated by use of the generating means in a waveguide region including the active layer,
   wherein the corrugation is formed outside an area which has the electromagnetic field intensity distribution, and
   wherein the active layer includes a gain distribution having a distribution pattern corresponding to the corrugation.

2. A semiconductor device according to claim 1, wherein the active layer further includes a refractive index distribution having a distribution pattern corresponding to the corrugation.

3. A semiconductor device according to claim 1, wherein the corrugation is periodical.

4. A semiconductor device according to claim 1, wherein the first and second semiconductor layers have an identical composition ratio with each other.

5. A semiconductor device according to claim 1, wherein the first semiconductor layer is a substrate.

6. A semiconductor device according to claim 1, wherein the corrugation is separated from the active layer by at least a guide wavelength which is defined by $d = \lambda/n$, where d is the guide wavelength, $\lambda$ is an oscillating wavelength, and n is an effective refractive index.

7. A semiconductor device according to claim 1, wherein the active layer is sufficiently thin to generate quantum effects.

8. A semiconductor device according to claim 6, wherein the gain distribution generates quantum effects in the active layer in a direction on a plane which is parallel to the active layer.

9. A semiconductor device according to claim 6, wherein the gain distribution generates quantum effects in the active layer in at least two directions on a plane which is parallel to the active layer.

10. A semiconductor device according to claim 2, wherein the active layer is sufficiently thin to generate quantum effects.

11. A semiconductor device according to claim 10, wherein the gain distribution and the refractive index distribution generate quantum effects in the active layer in a direction on a plane which is parallel to the active layer.

12. A semiconductor device according to claim 10, wherein the gain distribution and the refractive index distribution generate quantum effects in the active layer in at least two directions on a plane which is parallel to the active layer.

13. A semiconductor device according to claim 1, wherein the generating means includes a source electrode, a gate electrode and a drain electrode.

14. A semiconductor device according to claim 1, wherein each layer of the multiple layer structure is formed of a material selected from the group consisting of an AlGaAs semiconductor, an InP semiconductor, and a ZnCdSSe semiconductor.

15. A semiconductor device according to claim 1, wherein a distance between the active layer and the corrugation is 0.5 to 1.0 μm.

16. A semiconductor device, comprising:
a multiple layer structure including an active layer which is substantially flat, a first semiconductor layer and a second semiconductor layer adjacent to each other, the semiconductor layers having a corrugation at an interface therebetween; and
generating means which is connected to the multiple layer structure,
wherein an optical field intensity distribution is generated by use of the generating means in a waveguide region including the active layer,
wherein the corrugation is periodical and formed outside an area which has the optical field intensity distribution, and
wherein the active layer includes a gain distribution having a distribution pattern corresponding to the corrugation.

17. A semiconductor device according to claim 16, wherein the active layer further includes a refractive index distribution having a distribution pattern corresponding to the corrugation.

18. A semiconductor device according to claim 16, wherein the first and second semiconductor layers have an identical composition ratio with each other.

19. A semiconductor device according to claim 16, wherein the first semiconductor layer is a substrate.

20. A semiconductor device according to claim 16, wherein the corrugation is separated from the active layer by at least a guide wavelength which is defined by $d = \lambda/n$, where d is the guide wavelength, λ is an oscillating wavelength, and n is an effective refractive index.

21. A semiconductor device according to claim 16, wherein each layer of the multiple layer structure is formed of a material selected from the group consisting of an AlGaAs semiconductor, an InP semiconductor, and a ZnCdSSe semiconductor.

22. A semiconductor device according to claim 16, wherein a distance between the active layer and the corrugation is 0.5 to 1.0 μm.

23. A semiconductor device, comprising:
a multiple layer structure including an active layer which is substantially flat, a first semiconductor layer and a second semiconductor layer adjacent to each other, the semiconductor layers having a corrugation at an interface therebetween; and
generating means which is connected to the multiple layer structure,
wherein the active layer is sufficiently thin to generate quantum effects,
wherein an electronic field intensity distribution is generated by use of the generating means in a waveguide region including the active layer,
wherein the corrugation is formed outside an area which has the electronic field intensity distribution, and
wherein the active layer includes a gain distribution having a distribution pattern corresponding to the corrugation.

24. A semiconductor device according to claim 23, wherein the active layer further includes a refractive index distribution having a distribution pattern corresponding to the corrugation.

25. A semiconductor device according to claim 23, wherein the corrugation is periodical.

26. A semiconductor device according to claim 23, wherein the first semiconductor layer is a substrate.

27. A semiconductor device according to claim 23, wherein the gain distribution generates quantum effects in the active layer in a direction on a plane which is parallel to the active layer.

28. A semiconductor device according to claim 23, wherein the gain distribution generates quantum effects in the active layer in at least two directions on a plane which is parallel to the active layer.

29. A semiconductor device according to claim 24, wherein the gain distribution and the refractive index distribution generate quantum effects in the active layer in a direction on a plane which is parallel to the active layer.

30. A semiconductor device according to claim 24, wherein the gain distribution and the refractive index distribution generate quantum effects in the active layer in at least two directions on a plane which is parallel to the active layer.

31. A semiconductor device according to claim 23, wherein the generating means includes a source electrode, a gate electrode and a drain electrode.

32. A semiconductor device according to claim 23, wherein each layer of the multiple layer structure is formed of a material selected from the group consisting of an AlGaAs semiconductor, an InP semiconductor, and a ZnCdSSe semiconductor.

33. A method for producing a semiconductor device comprising a multiple layer structure including an active layer which is substantially flat, and a first semiconductor layer and a second semiconductor layer adjacent to each other, the semiconductor layers having a corrugation at an interface therebetween; and generating means; the method comprising the steps of:
preparing the multiple layer structure by forming the corrugation on an upper surface of the first semiconductor layer, and forming the rest of the multiple layer structure including the second semiconductor layer and the active layer by using a vapor phase growth method once so as to make the active layer substantially flat and to place the active layer at a distance from the corrugation; and
forming the generating means to be in contact with the multiple layer structure;
wherein the distance is set so that the corrugation is outside an area of an electromagnetic field intensity distribution which is generated by use of the generating means in a waveguide region including the active layer, and that the active layer includes a gain distribution having a distribution pattern corresponding to the corrugation.

34. A method for producing a semiconductor device according to claim 33, wherein the vapor phase growth method is a low-pressure metal organic chemical vapor deposition.

35. A method for producing a semiconductor device according to claim 33, wherein the corrugation is periodical.

36. A method for producing a semiconductor device according to claim 33, wherein the first and the second semiconductor layers have an identical composition ratio with each other.

37. A method for producing a semiconductor device according to claim 33, wherein the first semiconductor layer is a substrate.

38. A method for producing a semiconductor device according to claim 33, wherein the active layer is formed to be separated from the corrugation by at least a guide wavelength which is defined by $d=\lambda/n$, where d is the guide wavelength, $\lambda$ is an oscillating wavelength, and n is an effective refractive index.

39. A method for producing a semiconductor device according to claim 33, wherein the active layer is formed to be sufficiently thin to generate quantum effects.

40. A method for producing a semiconductor device according to claim 39, wherein the corrugation is formed to generate quantum effects in the active layer in a direction on a plane which is parallel to the active layer.

41. A method for producing a semiconductor device according to claim 39, wherein the corrugation is formed to generate quantum effects in the active layer in at least two directions on a plane which is parallel to the active layer.

42. A method for producing a semiconductor device according to claim 33, wherein the generating means is formed to include a source electrode, a gate electrode and a drain electrode.

43. A method for producing a semiconductor device according to claim 33, wherein each layer of the multiple layer structure is formed of a material selected from the group consisting of an AlGaAs semiconductor, an InP semiconductor, and a ZnCdSSe semiconductor.

44. A method for using a semiconductor device comprising the steps of:
providing a semiconductor device comprising a multiple layer structure including an active layer which is substantially flat, and a first semiconductor layer and a second semiconductor layer adjacent to each other, the semiconductor layers having a corrugation at an interface therebetween; and generating means which is connected to the multiple layer structure;
generating by use of the generating means an electromagnetic field intensity distribution in a waveguide region including the active layer so that the corrugation is outside an area which has the electromagnetic field intensity distribution, and that the active layer includes a gain distribution having a distribution pattern corresponding to the corrugation.

45. A method for using a semiconductor device according to claim 44, wherein the corrugation is periodical.

46. A method for using a semiconductor device according to claim 44, wherein the active layer is sufficiently thin to generate quantum effects.

* * * * *

UNITED STATES PATENT AND TRADEMARK OFFICE
CERTIFICATE OF CORRECTION

PATENT NO. : 5,309,472
DATED : May 3, 1994
INVENTOR(S) : Kuda, et al.

It is certified that error appears in the above-indentified patent and that said Letters Patent is hereby corrected as shown below:

Col. 5, Line 19:

is: 204 (thickness: 1.0 $\mu$m)

should read: 204 (thickness: 0.5 $\mu$m)

Signed and Sealed this

Thirteenth Day of September, 1994

Attest:

BRUCE LEHMAN

*Attesting Officer*     *Commissioner of Patents and Trademarks*